(12) United States Patent
Brask et al.

(10) Patent No.: US 6,974,764 B2
(45) Date of Patent: Dec. 13, 2005

(54) METHOD FOR MAKING A SEMICONDUCTOR DEVICE HAVING A METAL GATE ELECTRODE

(75) Inventors: Justin K. Brask, Portland, OR (US); Mark L. Doczy, Beaverton, OR (US); Jack Kavalieros, Portland, OR (US); Uday Shah, Portland, OR (US); Matthew V. Metz, Hillsboro, OR (US); Robert S. Chau, Beaverton, OR (US); Robert B. Turkot, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/704,497

(22) Filed: Nov. 6, 2003

(65) Prior Publication Data

US 2005/0101113 A1 May 12, 2005

(51) Int. Cl.⁷ ......................................... H01L 21/3205
(52) U.S. Cl. ...................... 438/585; 438/216; 438/287; 438/591
(58) Field of Search ................................ 438/199, 216, 438/233, 287, 585, 587, 591

(56) References Cited

U.S. PATENT DOCUMENTS

| | | | |
|---|---|---|---|
| 5,625,217 A | 4/1997 | Chau et al. | 257/412 |
| 5,753,560 A | 5/1998 | Hong et al. | 438/402 |
| 5,783,478 A | 7/1998 | Chau et al. | 438/592 |
| 5,891,798 A | 4/1999 | Doyle et al. | 438/624 |
| 6,048,769 A * | 4/2000 | Chau | 438/275 |
| 6,063,698 A | 5/2000 | Tseng et al. | 438/585 |
| 6,087,261 A | 7/2000 | Nishikawa et al. | 438/685 |
| 6,121,094 A | 9/2000 | Gardner et al. | 438/287 |
| 6,184,072 B1 | 2/2001 | Kaushik et al. | 438/197 |

(Continued)

OTHER PUBLICATIONS

Polishchuk et al. "Dual Workfunction CMOS Gate Technology Based on Metal Interdiffusion," www.eesc.berkeley.edu, 1 page.

Doug Barlage et al., "High–Frequency Response of 100nm Integrated CMOS Transistors with High–K Gate Dielectrics", 2001 IEEE, 4 pages.

Robert Chau et al., A 50nm Depleted–Substrate CMOS Transistor (DST), 2001 IEEE, 4 pages.

Lu et al., "Dual–Metal Gate Technology for Deep–Submicron CMOS Devices", dated Apr. 29, 2003, 1 page.

Schwantes et al., "Performance Improvement of Metal Gate CMOS Technologies with Gigabit Feature Sizes", Technical University of Hanburg–Harburg, 5 pages.

Parker et al., "A Method of Making Semiconductor Device Having a High–K Gate Dielectric", U.S. Appl. No. 10/285,915, filed Oct. 31, 2002.

Chau et al., "A Method of Making Semiconductor Device Having a High–K Gate Dielectric", U.S. Appl. No. 10/288,043, filed Nov. 5, 2002.

Parker et al., "A Method of Making Semiconductor Device Having a High–K Gate Dielectric", U.S. Appl. No. 10/315,268, filed Dec. 10, 2002.

Doczy et al., "A Method of Making Semiconductor Device Having a High–K Gate Dielectric", U.S. Appl. No. 10/338,174, filed Jan. 7, 2003.

(Continued)

*Primary Examiner*—Kevin M. Picardat
(74) *Attorney, Agent, or Firm*—Michael D. Plimier

(57) ABSTRACT

A method for making a semiconductor device is described. That method comprises forming a dielectric layer on a substrate, and forming a first metal layer on a first part of the dielectric layer, leaving a second part of the dielectric layer exposed. After a second metal layer is formed on both the first metal layer and the second part of the dielectric layer, a masking layer is formed on the second metal layer.

19 Claims, 3 Drawing Sheets

U.S. PATENT DOCUMENTS

| | | | | |
|---|---|---|---|---|
| 6,258,643 B1 | * | 7/2001 | Hsu | 438/199 |
| 6,306,742 B1 | | 10/2001 | Doyle et al. | 438/591 |
| 6,383,879 B1 | | 5/2002 | Kizilyalli et al. | 438/303 |
| 6,391,802 B1 | | 5/2002 | Delpech et al. | 438/785 |
| 6,420,279 B1 | | 7/2002 | Ono et al. | 438/785 |
| 6,436,777 B1 | | 8/2002 | Ota | 438/305 |
| 6,475,874 B2 | | 11/2002 | Xiang et al. | 438/396 |
| 6,514,828 B2 | | 2/2003 | Ahn et al. | 438/240 |
| 6,544,906 B2 | | 4/2003 | Rotondaro et al. | 438/785 |
| 6,617,209 B1 | | 9/2003 | Chau et al. | 438/240 |
| 6,617,210 B1 | | 9/2003 | Chau et al. | 438/240 |
| 6,642,131 B2 | | 11/2003 | Harada | 438/591 |
| 6,667,246 B2 | | 12/2003 | Mitsuhashi et al. | 438/756 |
| 6,727,130 B2 | * | 4/2004 | Kim et al. | 438/199 |
| 6,780,699 B2 | * | 8/2004 | Tamura et al. | 438/217 |
| 6,794,234 B2 | * | 9/2004 | Polishchuk et al. | 438/199 |
| 2002/0135023 A1 | | 9/2002 | Madhukar et al. | 257/371 |
| 2002/0197790 A1 | | 12/2002 | Kizilyalli et al. | 438/240 |
| 2003/0032303 A1 | | 2/2003 | Yu et al. | 438/770 |
| 2003/0045080 A1 | | 3/2003 | Visokay et al. | 438/591 |
| 2004/0106249 A1 | * | 6/2004 | Huotari | 438/216 |

OTHER PUBLICATIONS

Brask et al., "A Method of Making Semiconductor Device Having a High–K Gate Dielectric", U.S. Appl. No. 10/387,303, filed Mar. 11, 2003.

Brask et al., "A Method of Making Semiconductor Device Having a High–K Gate Dielectric", U.S. Appl. No. 10/391,816, filed Mar. 18, 2003.

Chau et al., "A Method for Making a Semiconductor Device Having a Metal Gate Electrode", U.S. Appl. No. 10/431,166, filed May 6, 2003.

Brask, et al, "A Method for Making a Semiconductor Device Having a High–K Gate Dielectric", U.S. Appl. No. 10/441,616, filed May 20, 2003.

Brask et al. "A Selective Etch Process for Making a Semiconductor Device Having a High–K Gate Dielectric," U.S. Appl. No. 10/652,546, filed Aug. 28, 2003.

Brask et al. "A Method for Making a Semiconductor Device Having a High–K Gate Dielectric," U.S. Appl. No. 10/642,796, filed Aug. 28, 2003.

Brask, "Methods and Compositions for Selectively Etching Metal Films and Structures," U.S. Appl. No. 10/658,225, filed Sep. 8, 2003.

* cited by examiner

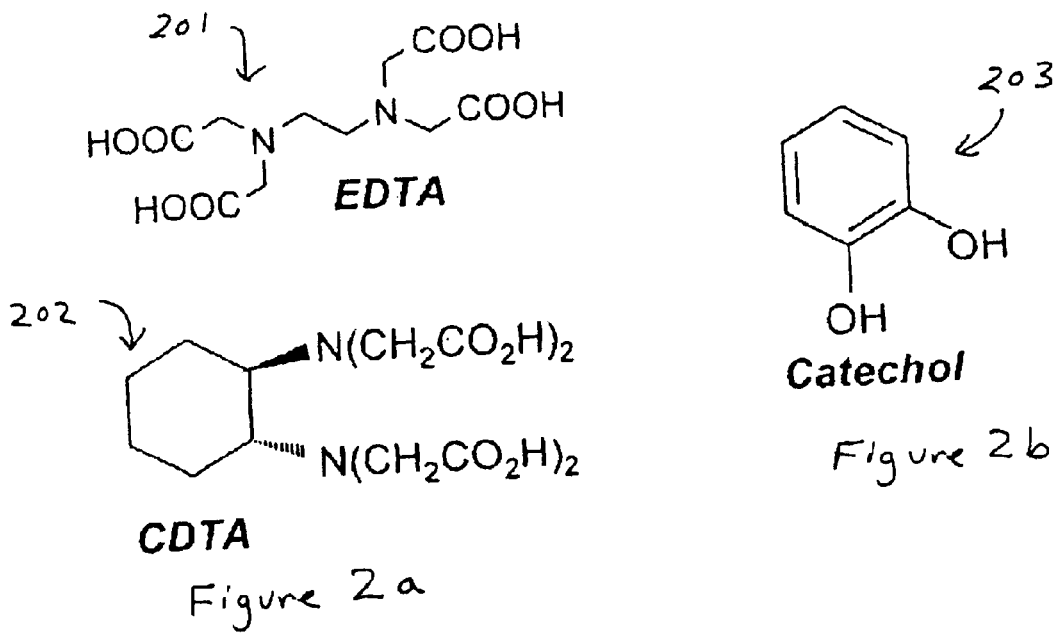
Figure 2a
Figure 2b
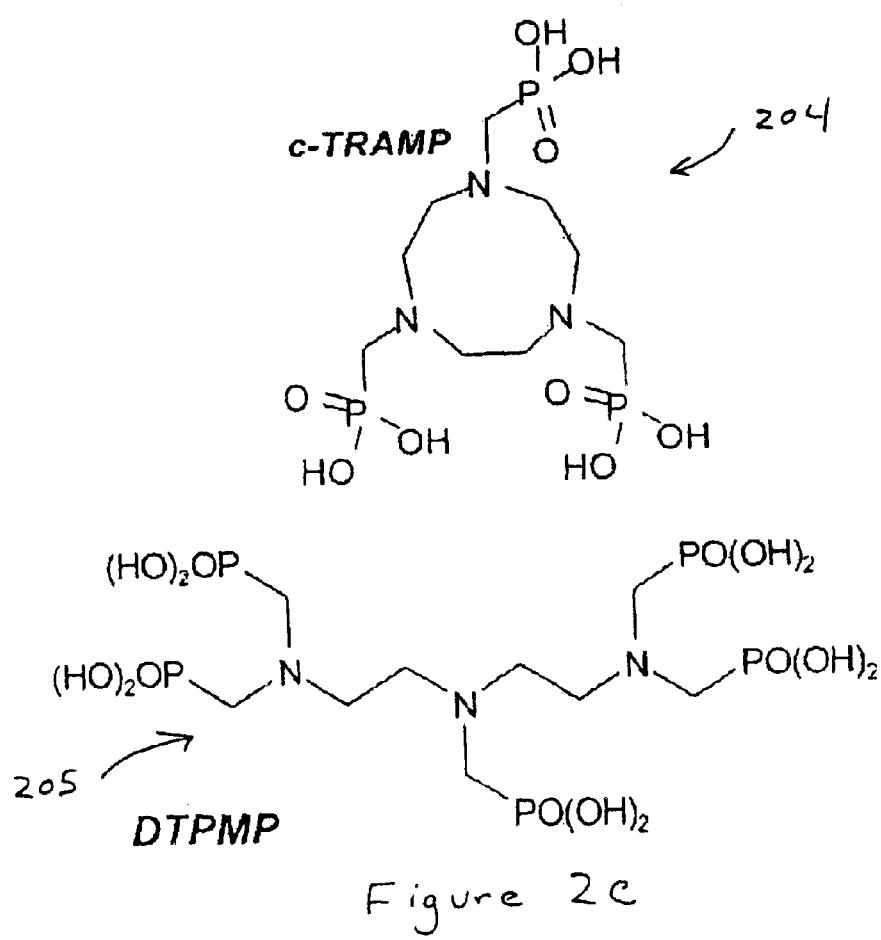
Figure 2c

METHOD FOR MAKING A SEMICONDUCTOR DEVICE HAVING A METAL GATE ELECTRODE

FIELD OF THE INVENTION

The present invention relates to methods for making semiconductor devices, in particular, semiconductor devices that include metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

The optimal workfunction for a metal gate electrode will differ depending upon whether it is used to form an NMOS transistor or a PMOS transistor. For that reason, when the same material is used to make metal gate electrodes for NMOS and PMOS transistors, the gate electrodes cannot demonstrate the desired workfunction for both types of devices. It may be possible to address this problem by forming the NMOS transistor's metal gate electrode from a first material and the PMOS transistor's metal gate electrode from a second material. The first material may ensure an acceptable workfunction for the NMOS gate electrode, while the second material may ensure an acceptable worktunction for the PMOS gate electrode. Processes for forming such dual metal gate devices may, however, be complex and expensive.

Accordingly, there is a need for an improved process for making a semiconductor device that includes a metal gate electrode. There is a need for a relatively inexpensive and uncomplicated process for making a device with metal gate electrodes that have optimal workfunctions for both NMOS and PMOS transistors. The method of the present invention provides such a process.

BRIEF DESCRIPTION OF THE DRAWINGS

FIGS. 2a–2c identify hexa-dentate chelating agents that may be used in an embodiment of the method of the present invention.

Figure 1A:
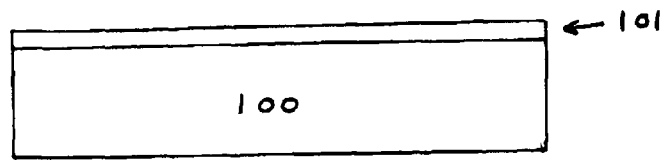
FIGS. 1a–1h represent cross-sections of structures that may be formed when carrying out an embodiment of the method of the present invention.
Figure 1B:
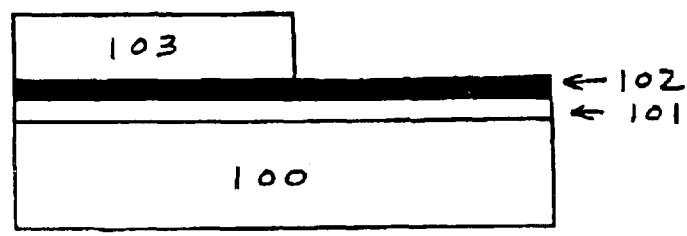
Figure 1C:
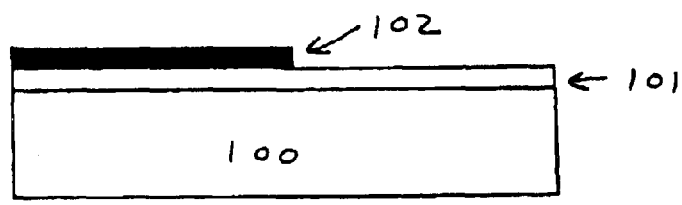

Features shown in these figures are not intended to be drawn to scale.

DETAILED DESCRIPTION OF THE PRESENT INVENTION

A method for making a semiconductor device is described. That method comprises forming a dielectric layer on a substrate, and forming a first metal layer on a first part of the dielectric layer. A second part of the dielectric layer is left exposed. After a second metal layer is formed on the first metal layer and the second part of the dielectric layer, a masking layer is formed on the second metal layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIGS. 1a–1h illustrate structures that may be formed, when carrying out an embodiment of the method of the present invention. Initially, dielectric layer 101 is formed on substrate 100, generating the FIG. 1a structure. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dielectric layer 101 preferably comprises a high-k gate dielectric layer. Some of the materials that may be used to make high-k gate dielectrics include: hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form dielectric layer 101 are described here, that layer may be made from other materials that serve to reduce gate leakage.

Dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 60 angstroms thick, and more preferably between about 5 angstroms and about 40 angstroms thick.

After dielectric layer 101 is formed on substrate 100, first metal layer 102 is formed on dielectric layer 101. Part of layer 102 is then masked by masking layer 103—generating the FIG. 1b structure. First metal layer 102 may comprise any conductive material from which a metal gate electrode may be derived. First metal layer 102 preferably has etch and thermal stability characteristics that render it suitable for making metal gate electrodes for a semiconductor device. In this regard, it may be desirable for first metal layer 102 to tolerate relatively high temperatures, e.g., temperatures that exceed about 900° C. If first metal layer 102 can withstand such relatively high temperatures, it may be easier in some cases to integrate that layer into the overall process for making the semiconductor device.

Although in some embodiments first metal layer 102 should be formed from a material that may endure high temperatures, the method of the present invention permits the use of other materials. For example, when first metal layer 102 comprises an n-type metal, it may be formed from materials that can or cannot withstand high temperatures. Examples of n-type materials that may be used to form first metal layer 102 include: hafnium, zirconium, titanium, tantalum, aluminum, and metal carbides that include these elements, i.e., titanium carbide, zirconium carbide, tantalum carbide, hafnium carbide and aluminum carbide.

First metal layer 102 may be formed on dielectric layer 101 using well known PVD or CVD processes. When first metal layer 102 comprises an n-type material, layer 102 preferably has a workfunction that is between about 3.9 eV and about 4.2 eV. First metal layer 102 should be thick enough to ensure that any material formed on it will not significantly impact its workfunction. Preferably, first metal layer 102 is between about 25 angstroms and about 300 angstroms thick, and more preferably is between about 25 angstroms and about 200 angstroms thick.

Dopants may be added to first metal layer 102, as it is formed or after it is formed, to shift layer 102's workfunction to ensure that it falls within the desired range. When a CVD process is used to add dopants to metal layer 102, the resulting dopant concentration may be controlled by varying the type and quantity of elements that are included in the process gases, which are fed into the CVD reactor, and the deposition temperature. The optimal concentration of any dopant that is added to first metal layer 102 to shift its workfunction to a targeted level may depend upon the composition and properties of layer 102 (including its initial workfunction), the type of dopant used, and the target workfunction. Metal layers that are doped as, or after, they are deposited fall within the definition of "metal layer," as that term is used in this application.

Masking layer 103 may be formed from conventional materials using conventional techniques. In one embodiment, masking layer 103 may comprise a silicon nitride or silicon dioxide hard mask, which may be formed using deposition techniques that are well known to those skilled in the art. After masking layer 103 is deposited on layer 102, conventional photolithography and etch processes may be applied to remove part of masking layer 103, exposing a first portion of first metal layer 102 and yielding the FIG. 1b structure.

After patterning masking layer 103, a first portion of first metal layer 102 is removed, leaving part of dielectric layer 101 exposed. A plasma dry etch process, e.g., one using a chlorine based plasma, may be applied to remove a first portion of layer 102 selective to dielectric layer 101. Although a dry etch process is preferred, a wet etch process may be used instead as long as it does not remove a significant amount of layer 102 from beneath masking layer 103. After first metal layer 102 is etched, the remainder of masking layer 103 is removed, generating the FIG. 1c structure.

Figure 1D:
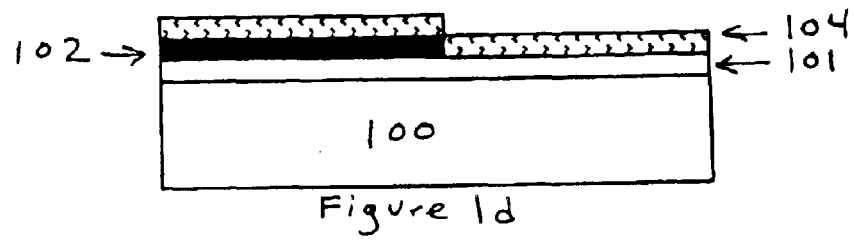

In this embodiment, second metal layer 104 is then deposited on first metal layer 102 and on the exposed portion of dielectric layer 101—generating the structure illustrated by FIG. 1d. When first metal layer 102 comprises an n-type metal, second metal layer 104 preferably comprises a p-type metal. Examples of potentially suitable p-type metals for forming second metal layer 104 include: ruthenium, palladium, platinum, cobalt, nickel, and conductive metal oxides, e.g., ruthenium oxide.

Second metal layer 104 may be formed on dielectric layer 101 and first metal layer 102 using a conventional PVD or CVD process, preferably is between about 25 angstroms and about 300 angstroms thick, and more preferably is between about 25 angstroms and about 200 angstroms thick. In a preferred embodiment, when second metal layer 104 comprises a p-type material, layer 104 has a workfunction that is-between about 4.9 eV and about 5.2 eV.

As with first metal layer 102, dopants may be added to second metal layer 104, as it is formed, to shift layer 104's workfunction to the desired level. In some embodiments, first metal layer 102 and second metal layer 104 may each comprise the same mid-gap metal, e.g., titanium nitride or tantalum nitride. The workfunction of a layer that includes such a mid-gap metal may be shifted up or down by adding an element to that layer that has a relatively low electronegativity or a relatively high electronegativity. When an n-type metal is desired for first metal layer 102, the workfunction of that layer may be shifted to about 4.2 eV or less by adding to a mid-gap metal an element with a relatively low electronegativity, e.g., aluminum. When a p-type metal is desired for second metal layer 104, the workfunction of that layer may be shifted to about 4.9 eV or higher by adding to a mid-gap metal an element with a relatively high electronegativity, e.g., chlorine.

Although a few examples of materials that may be used to form first and second metal layers 102 and 104 are described here, those layers may be made from many other materials. The term "metal layer," as used in this application, thus encompasses any conductive material from which a metal gate electrode may be derived.

Figure 1E:
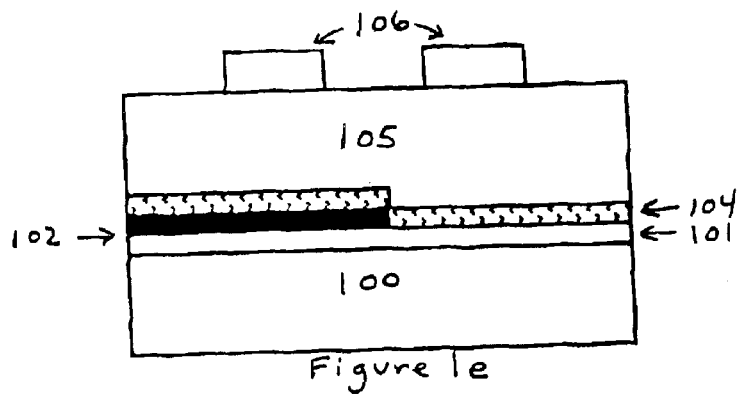
Figure 1F:
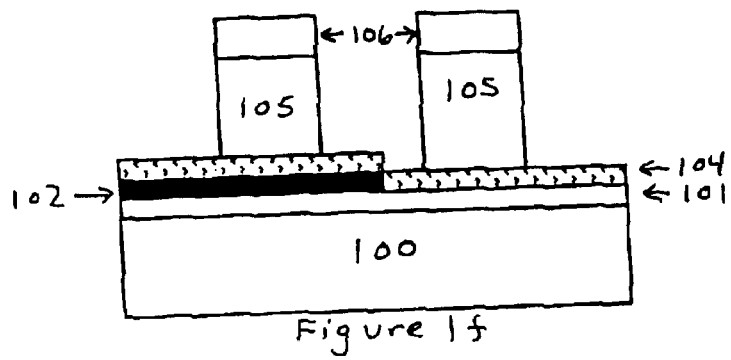

After depositing second metal layer 104 on first metal layer 102 and dielectric layer 101, masking layer 105 is deposited on second metal layer 104. Masking layer 106 is then formed on masking layer 105 and patterned to define sections of masking layer 105 to be removed and sections to be retained. FIG. 1e represents a cross-section of the structure that results after masking layer 106 is deposited on masking layer 105, and then patterned.

In a preferred embodiment, masking layer 105 comprises a polysilicon containing layer, which may be deposited using conventional methods and which preferably is between about 500 angstroms and about 2,000 angstroms thick. Such a polysilicon layer may be undoped or doped with either n-type or p-type impurities. Layer 106 may comprise conventional materials, e.g., silicon nitride or silicon dioxide, and may be deposited and patterned using conventional techniques.

After layer 106 is patterned, a first portion of layer 105 is removed selective to second metal layer 104 to expose part of layer 104 and to create the figure if structure. A dry etch process may be used to etch layer 105. Such a dry etch process may employ a plasma that is derived from sulfur hexafluoride, hydrogen bromide, hydrogen iodide, chlorine, argon, oxygen and/or helium. The optimal process for etching layer 105 may depend upon the material used for second metal layer 104, the degree to which layer 105 is doped, and the desired profile for the resulting etched layer.

Figure 1G:
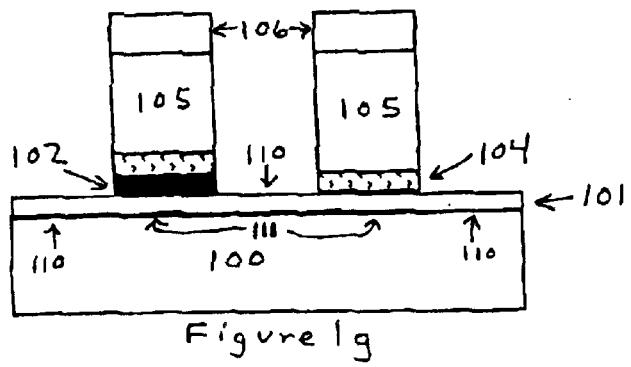
Figure 1H:
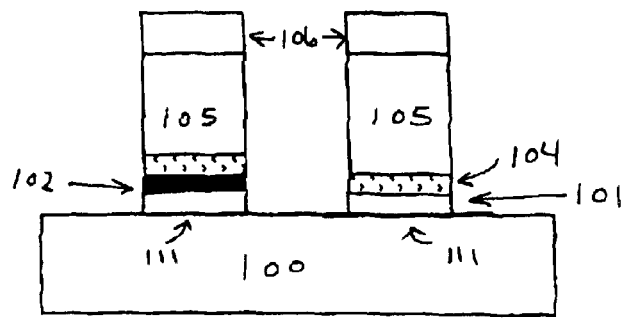

The exposed portion of second metal layer 104 and the underlying portion of first metal layer 102 are then removed, to generate the FIG. 1g structure. Conventional dry etch or wet etch processes may be used to remove those layers. It may, however, be difficult to etch metal layers 104 and 102 selectively to dielectric layer 101 using a dry etch process. In addition, because commonly used wet etch techniques typically etch metal layers isotropically, applying such a process to the FIG. 1f structure may etch portions of metal layers 102 and 104 from beneath masking layer 105. The resulting undercut may have adverse consequences.

As an alternative to applying well established etch processes to remove the exposed portion of second metal layer 104 and the underlying portion of first metal layer 102, a wet etch process that employs a chelating agent (e.g., an organic compound that may bind to a metal ion to form a chelate)

may be used. Examples of potentially useful chelating agents include those that have been employed to remove metallic contaminants from semiconductor substrates.

FIGS. 2a–2c identify some hexa-dentate chelating agents (i.e., chelating agents with six bonding atoms) that may be used. These include: carboxylic acid based chelating agents 201 and 202 (EDTA and CDTA, respectively); catechol 203 (representative of phenol derivatives that may be used); and phosphonic acid based chelating agents 204 and 205 (c-TRAMP and DTPMP). When such well known chelating agents are added to an aqueous solution to etch metal layers 104 and 102, they should be included at a concentration of between about 0.5 and about 5.0 moles/liter. The device should be exposed to such a solution for a sufficient amount of time to remove substantially all of the exposed portions of metal layers 104 and 102.

Depending upon the materials used for metal layers 104 and 102 and for dielectric layer 101, it may be desirable to modify the chelating agents described above (or to employ other types of chelating agents) to ensure that layers 104 and 102 are etched selectively to layer 101. A chelating agent that is tailored to bind with ions of a specific metal may selectively etch a layer that includes that metal without significantly etching an underlying film having a different composition. In this respect, parts of a chelating agent, e.g., aryl or alkyl groups, may be modified to enhance its ability to bind to a specific metal (or metals) to enable selective etching of that metal.

When second metal layer 104 and first metal layer 102 comprise multiple components, a wet etch chemistry for etching those layers may include multiple chelating agents—with different agents having an affinity to bind to different components that are contained in those layers. The relative concentration of each chelating agent included in such a solution may be proportional to the relative amounts of each component included in the metal layers.

The chelating agent or agents selected for the wet etch chemistry used to etch layers 104 and 102 should be combined with a suitable solvent to maximize etch selectively. The best solvent for etching layers 104 and 102 selectively to layer 101 may be de-ionized water. In other embodiments, the optimum solvent may be acidic or basic, and may comprise many types of polar and/or nonpolar components, depending upon the composition of layers 104, 102, and 101. Although in a preferred embodiment, the same wet etch chemistry is used to etch both layers 104 and 102, different wet etch chemistries may be used to etch those layers.

Exposing layers 104 and 102 to a wet etch chemistry that includes a chelating agent or agents may etch those layers selectively to dielectric layer 101, without significantly etching those materials from beneath masking layer 105. In a preferred embodiment, using such a wet etch chemistry to etch layers 104 and 102 ensures that less than about 100 angstroms of those layers will be removed from beneath masking layer 105. In an even more preferred embodiment, such an etch process will undercut masking layer 105 by less than about 50 angstroms. Using a chelating agent to etch layers 104 and 102 may provide another benefit. Forming chelates that include extracted metal ions causes those ions to be held in solution—preventing, or at least substantially reducing, metal redeposition.

After metal layers 104 and 102 are etched, the exposed portion of dielectric layer 101 is removed, e.g., using any etch process suitable for removing such a layer. Like processes for etching metal layers 104 and 102, it may be difficult to etch dielectric layer 101 selectively to the underlying substrate using a dry etch process, and wet etch techniques may etch dielectric layer 101 isotropically—undercutting the overlying structure in an undesirable fashion.

To minimize the lateral removal of dielectric layer 101, as exposed portion 110 of that layer is etched, exposed portion 110 of dielectric layer 101 may be modified to facilitate its removal selectively to covered portion 111 of that layer. Exposed portion 110 may be modified by adding impurities to that portion of dielectric layer 101 after metal layers 104 and 102 have been etched. A plasma enhanced chemical vapor deposition ("PECVD") process may be used to add impurities to exposed portion 110 of dielectric layer 101. In such a PECVD process, a halogen or halide gas (or a combination of such gases) may be fed into a reactor prior to striking a plasma. The reactor should be operated under the appropriate conditions (e.g., temperature, pressure, radio frequency, and power) for a sufficient time to modify exposed portion 110 to ensure that it may be removed selectively to other materials. In a preferred embodiment, a low power PECVD process, e.g., one taking place at less than about 200 watts, is used.

In a particularly preferred embodiment, hydrogen bromide ("HBr") and chlorine ("$Cl_2$") gases are fed into the reactor at appropriate flow rates to ensure that a plasma generated from those gases will modify exposed portion 110 in the desired manner. Between about 50 and about 100 watts wafer bias (preferably about 100 watts) may be applied for a sufficient time to complete the desired transformation of exposed portion 110. Plasma exposure lasting less than about one minute, and perhaps as short as 5 seconds, may be adequate to cause that conversion.

After exposed portion 110 has been modified, it is removed. The presence of the added impurities enables that exposed portion to be etched selectively to covered portion 111 to generate the FIG. 1h structure. In a preferred embodiment, exposed portion 110 is removed by exposing it to a relatively strong acid, e.g., a halide based acid (such as hydrobromic or hydrochloric acid) or phosphoric acid. When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid preferably contains between about 75% and about 95% $H_3PO_4$ by volume. An etch process that uses such an acid preferably takes place at between about 140° C. and about 180° C., and more preferably at about 160° C. When such an acid is used, the exposure step should last between about 30 seconds and about 5 minutes—and preferably for about one minute for a 20 angstrom thick film.

As an alternative to adding impurities to exposed portion 110 to modify that portion of dielectric layer 101 prior to removing it, exposed portion 110 may be modified by subjecting it to a reducing agent. When dielectric layer 101 comprises a metal oxide layer, such a treatment may convert that metal oxide layer into a metal layer. Such a metal layer may then be removed selectively to covered portion 111 of dielectric layer 101, minimizing undercut of the gate electrode stack. In one embodiment, a chelating agent based wet chemistry, similar to that used to remove exposed portions of metal layers 104 and 102, may be used to remove the metal layer, which results from uncovered portion 110's exposure to a reducing agent.

Process steps for completing the device that follow the dielectric layer etch, e.g., forming sidewall spacers on the gate electrode stacks, source and drain regions and the device's contacts, are well known to those skilled in the art and will not be described in more detail here. In this regard, using dummy doped polysilicon layers for masking layer 105 may enable one to apply commonly used nitride spacer, source/drain, and silicide formation techniques, when completing the structure.

Metal layers of different conductivity type may be deposited in either order. As illustrated, first metal layer 102 may comprise an n-type metal, and second metal layer 104 may comprise a p-type metal. Alternatively, first metal layer 102 may comprise a p-type metal, and second metal layer 104 may comprise an n-type metal. It may, for example, be desirable to form first metal layer 102 from a p-type material, when high temperature process steps will follow the formation of layers 102 and 104.

When masking layer 105 comprises a doped polysilicon layer, it may be necessary to apply a high temperature anneal to that layer, e.g., when a subsequently formed silicide will not extend completely through it. When a high temperature anneal must be applied to such a layer, it may be desirable to form first metal layer 102 from a p-type material. In other embodiments, such as those in which substantially all of a polysilicon layer is converted into a silicide, it may be possible to omit high temperature process steps (or limit their duration), which may enable metal layers 102 and 104 to be made from temperature sensitive materials.

As illustrated above, the method of the present invention enables production of CMOS devices that include metal gate electrodes with appropriate workfunctions for both NMOS and PMOS transistors—without having to perform the complex and costly process steps that current dual metal gate electrode processes require. Although the embodiments described above provide examples of processes for forming such devices, the present invention is not limited to these particular embodiments.

In addition to the methods set forth above, applicants' invention contemplates a semiconductor device that comprises dielectric layer 101, which is formed on substrate 100, and a pair of gate electrode stacks, which are formed on dielectric layer 101. As illustrated, one stack may comprise a first metal layer upon which are formed a second metal layer and a masking layer, and the other stack may comprise only the second metal layer and a masking layer.

The three layer gate electrode stack may serve as the gate electrode for an NMOS transistor with a workfunction between about 3.9 eV and about 4.2 eV, while the two layer gate electrode stack may serve as the gate electrode for a PMOS transistor with a workfunction between about 4.9 eV and about 5.2 eV. Alternatively, the three layer gate electrode stack may serve as the gate electrode for a PMOS transistor, while the two layer gate electrode stack may serve as the gate electrode for an NMOS transistor.

The first metal layer should set the transistor's workfunction, regardless of the composition of the remainder of the gate electrode stack. For that reason, the presence of the second metal layer on top of the first metal layer in the three layer gate electrode stack, and the presence of a dummy doped polysilicon layer in either a three or two layer gate electrode stack, should not affect the workfunction of that stack in a meaningful way.

Although such a polysilicon layer should not affect the workfunction of an underlying metal layer, that polysilicon layer may serve as an extension of the transistor's contacts, as well as a support for the nitride spacers. It also defines the transistor's vertical dimension. Gate electrode stacks that include such a polysilicon layer are thus considered to be "metal gate electrodes," as are gate electrode stacks that include one or more metal layers, but do not include a polysilicon layer.

Although the semiconductor device that is described in this application may be made using the processes set forth in detail above, it may alternatively be formed using other types of processes. For that reason, the semiconductor device of the present invention is not intended to be limited to devices that may be made using the processes described above.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming a dielectric layer on a substrate;

forming a first metal layer on a first part of the dielectric layer, leaving a second part of the dielectric layer exposed;

forming a second metal layer on the first metal layer and on the second part of the dielectric layer; and then forming a masking layer that comprises polysilicon on the second metal layer.

2. The method of claim 1 wherein the dielectric layer comprises a high-k gate dielectric layer.

3. The method of claim 2 wherein the high-k gate dielectric layer is formed by atomic layer chemical vapor deposition, and comprises a material selected from the group consisting of hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate.

4. The method of claim 1 wherein the first metal layer comprises a material that is selected from the group consisting of hafnium, zirconium, titanium, tantalum, aluminum, and a metal carbide, and the second metal layer comprises a material that is selected from the group consisting of ruthenium, palladium, platinum, cobalt, nickel, and a conductive metal oxide.

5. The method of claim 1 wherein the first metal layer comprises a material that is selected from the group consisting of ruthenium, palladium, platinum, cobalt, nickel, and a conductive metal oxide and the second metal layer comprises a material that is selected from the group consisting of hafnium, zirconium, titanium, tantalum, aluminum, and a metal carbide.

6. The method of claim 1 wherein the first and second metal layers are each between about 25 and about 300 angstroms thick, the first metal layer has a workfunction that is between about 3.9 eV and about 4.2 eV, and the second metal layer has a workfunction that is between about 4.9 eV and about 5.2 eV.

7. The method of claim 1 wherein the first and second metal layers are each between about 25 and about 300 angstroms thick, the first metal layer has a workfunction that is between about 4.9 eV and about 5.2 eV, and the second metal layer has a workfunction that is between about 3.9 eV and about 4.2 eV.

8. The method of claim 1 further comprising etching the masking layer, the second metal layer, the first metal layer, and the dielectric layer.

9. The method of claim 8 wherein a plasma dry etch process is applied to etch the masking layer selectively to the second metal layer, and a wet etch process is used to etch the second metal layer and the first metal layer.

10. A method for making a semiconductor device comprising:
   forming a high-k gate dielectric layer on a substrate;
   forming a first metal layer on the high-k gate dielectric layer;
   removing a first portion of the first metal layer;
   forming a second metal layer on the first metal layer and on the high-k gate dielectric layer, a first portion of the second metal layer covering the remaining portion of the first metal layer and a second portion of the second metal layer covering the high-k gate dielectric layer;
   forming a polysilicon containing layer on the second metal layer;
   removing a first portion of the polysilicon layer to expose part of the second metal layer; and
   removing the exposed part of the second metal layer and the underlying part of the first metal layer.

11. The method of claim 10 wherein the first and second metal layers are each between about 25 and about 300 angstroms thick, the first metal layer has a workfunction that is between about 3.9 eV and about 4.2 eV, and the second metal layer has a workfunction that is between about 4.9 eV and about 5.2 eV.

12. The method of claim 10 wherein the first and second metal layers are each between about 25 and about 300 angstroms thick, the first metal layer has a workfunction that is between about 4.9 eV and about 5.2 eV, and the second metal layer has a workfunction that is between about 3.9 eV and about 4.2 eV.

13. The method of claim 10 wherein a plasma dry etch process is applied to remove the first portion of the polysilicon layer selectively to the second metal layer, and a wet etch chemistry that includes a chelating agent is applied to the exposed part of the second metal layer and the underlying part of the first metal layer to remove those layers selectively to the high-k gate dielectric layer.

14. The method of claim 13 wherein the wet etch chemistry comprises an aqueous solution that includes between about 0.5 and about 5.0 moles/liter of the chelating agent.

15. A method for making a semiconductor device comprising:
   forming a high-k gate dielectric layer on a substrate;
   forming a first metal layer on the high-k gate dielectric layer, the first metal layer being between about 25 and about 300 angstroms thick;
   removing a first portion of the first metal layer;
   forming a second metal layer on the first metal layer and on the high-k gate dielectric layer, the second metal layer being between about 25 and about 300 angstroms thick, a first portion of the second metal layer covering the remaining portion of the first metal layer and a second portion of the second metal layer covering the high-k gate dielectric layer;
   forming a polysilicon containing layer on the second metal layer;
   applying a plasma dry etch process to remove a first portion of the polysilicon layer selectively to the second metal layer to expose part of the second metal layer; and
   applying a wet etch chemistry that includes a chelating agent to the exposed part of the second metal layer and the underlying part of the first metal layer to remove those layers selectively to the high-k gate dielectric layer.

16. The method of claim 15 wherein the first metal layer has a workfunction that is between about 3.9 eV and about 4.2 eV and serves as a gate electrode for an NMOS transistor, the second metal layer has a workfunction that is between about 4.9 eV and about 6.2 eV and serves as a gate electrode for a PMOS transistor, and the wet etch chemistry comprises an aqueous solution that includes between about 0.5 and about 5.0 moles/liter of the chelating agent.

17. The method of claim 16 wherein the first metal layer comprises a material that is selected from the group consisting of hafnium, zirconium, titanium, tantalum, aluminum, and a metal carbide, and the second metal layer comprises a material that is selected from the group consisting of ruthenium, palladium, platinum, cobalt, nickel, and a conductive metal oxide.

18. The method of claim 15 wherein the first metal layer has a work function that is between about 4.9 eV and about 5.2 eV and serves as a gate electrode for an PMOS transistor, the second metal layer has a workfunction that is between about 3.9 eV and about 4.2 eV and serves as a gate electrode for a NMOS transistor, and the wet etch chemistry comprises an aqueous solution that includes between about 0.5 and about 5.0 moles/liter of the chelating agent.

19. The method of claim 18 wherein the first metal layer comprises a material that is selected from the group consisting of ruthenium, palladium, platinum, cobalt, nickel, and a conductive metal oxide and the second metal layer comprises a material that is selected from the group consisting of hafnium, zirconium, titanium, tantalum, aluminum, and a metal carbide.

* * * * *